United States Patent [19]
Nakamura

[11] Patent Number: 5,473,558
[45] Date of Patent: Dec. 5, 1995

[54] METHOD FOR GENERATING HARDWARE DESCRIPTION OF MULTIPLIER AND/OR MULTIPLIER-ADDER

[75] Inventor: Kenichiro Nakamura, Saitama, Japan

[73] Assignee: Sony Corporation, Japan

[21] Appl. No.: 184,628

[22] Filed: Jan. 21, 1994

[30] Foreign Application Priority Data

Jan. 22, 1993 [JP] Japan ................. 5-009384

[51] Int. Cl.⁶ .................. G06F 7/00; G06F 15/00
[52] U.S. Cl. ............. 364/750.5; 364/754; 364/758
[58] Field of Search .................. 364/750.5, 751, 364/754–760, 715.08, 788

[56] References Cited

U.S. PATENT DOCUMENTS 4,736,335  4/1988  Barkan ........................... 364/758
4,852,037  7/1989  Aoki ............................... 364/758

FOREIGN PATENT DOCUMENTS

5-20378  1/1993  Japan.

Primary Examiner—Roy N. Envall, Jr.
Assistant Examiner—Emmanuel L. Moise
Attorney, Agent, or Firm—Pasquale Musacchio; Jerry A. Miller

[57] ABSTRACT

A method for generating a hardware description of a multiplier/multiplier-adder for integrating a signal processing circuit includes the steps of acquiring input parameters such as a word length of multiplier factor, generating a first hardware description of a first add for adding partial products and an inputs addend, determining a redundancy index r by using the input parameters, generating a second hardware description of a second add circuit for performing a carry-add of every r bits of the output of the first add circuit, and replacing useless circuits from the hardware descriptions.

6 Claims, 12 Drawing Sheets

METHOD FOR GENERATING HARDWARE DESCRIPTION OF MULTIPLIER AND/OR MULTIPLIER-ADDER

FIELD OF THE INVENTION

This invention relates to a method for generating a hardware description of a multiplier and/or a multiplier-adder which is utilized for integrating a digital signal processing circuit.

BACKGROUND OF THE INVENTION

Figure 5:
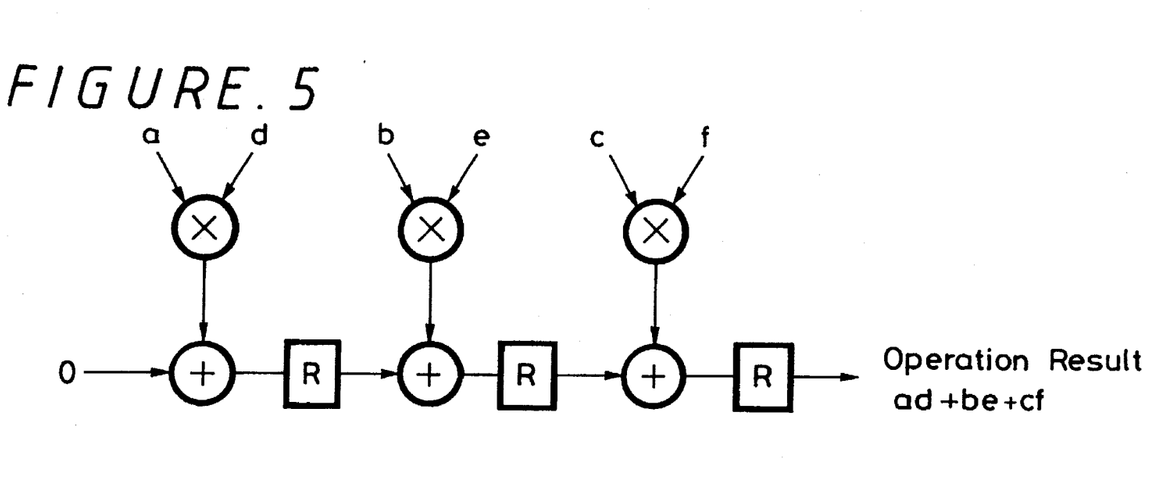
FIG. 5 is a view showing an inner product operation circuit of a conventional multiplier.
Figure 6:
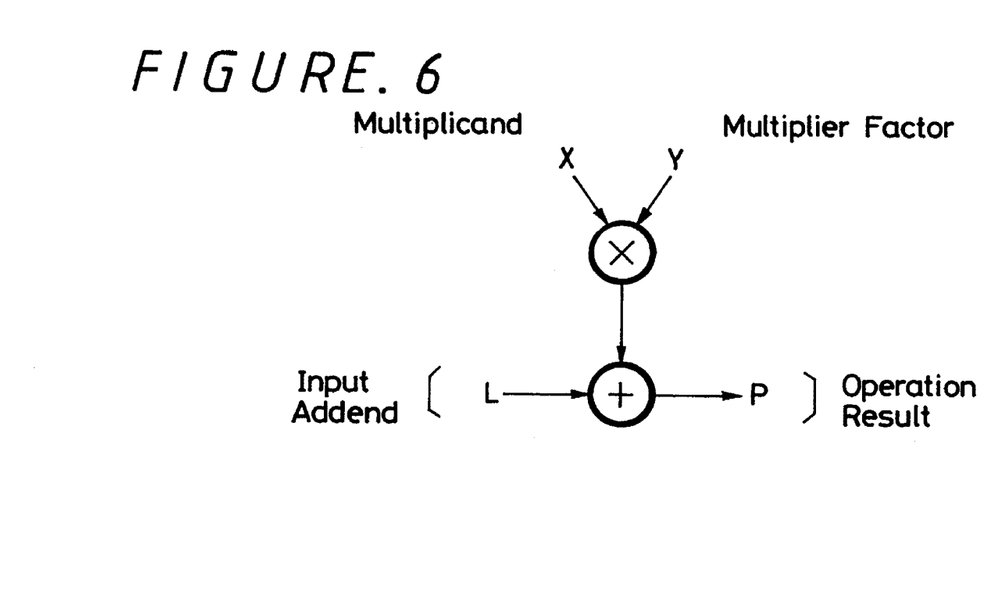
FIG. 6 is a view showing a multiplication-add circuit of a conventional multiplier.

There is known an inner product operation circuit as shown in FIG. 5 for calculating an inner product ad+be+cf of two vectors A(a,b,c) and B(d,e,f). "R" expresses a pipeline register for a high speed operation in FIG. 5. FIG. 5 is attained by combining a multiplier-adder as shown in FIG. 6.

Figure 7:
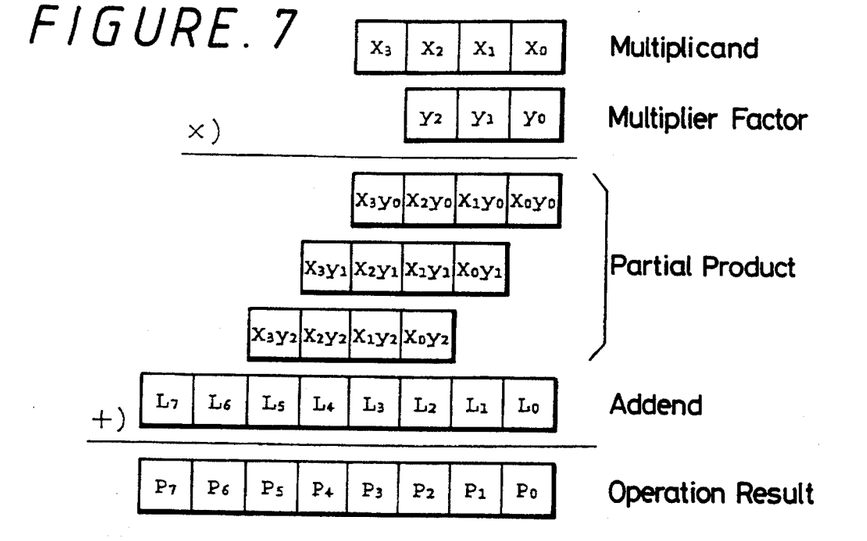
FIG. 7 is a view showing multiplication-add circuit of a conventional multiplier.

The operation of the multiplier-adder (FIG. 6) is shown in FIG. 7. Namely the partial products $X_i * y_j$ of the multiplicands ($X_3, X_2, X_1, X_0$) and the multiplier factors ($Y_2, Y_1, Y_0$) are added to the addends ($L_7, L_6, L_5, L_4, L_3, L_2, L_1, L_0$). The operation results ($P_7, P_6, P_5, P_4, P_3, P_2, P_1, P_0$) are obtained thereby.

A carry-save system is utilized for the calculation shown in FIG. 7. The carry-save system is an add system which decreases the number of partial product gradually. In the carry-save system, three signals of the same digit position are added by a full adder. Two signals, a carry signal and a sum signal are generated thereby. When the partial products which should be added have been reduced to two signals, carry signal and a sum signal per digit position, the carry-add operation is performed. The operation result P is obtained thereby.

A carry-add takes the most time in the operation of FIG. 7. Therefore, generally, a redundancy binary notation is utilized for an input and an output, because it does not need the carry-add. The operation of the multiplier-adder using a redundancy binary notation is shown in FIG. 8.

Figure 8:
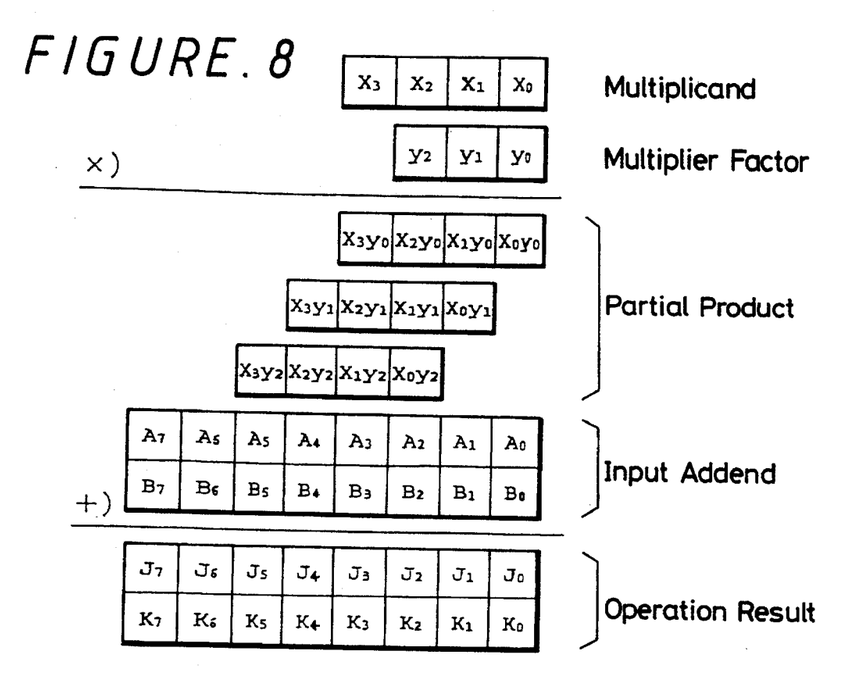
FIG. 8 is a view showing a multiplication-add circuit using a redundancy notation of a conventional multiplier.

The multiplier-adder shown in FIG. 8 does not execute the last carry-add, because the operation result has redundancy notation ($J_7, J_6, J_5, J_4, J_3, J_2, J_1, J_0$) and ($K_7, K_6, K_5, K_4, K_3, K_2, K_1, K_0$).

When an inner product operation circuit is constructed by combining multiplier-adders, the output from one multiplier-adder is connected to the addend input of the next multiplier-adder. The input addend of FIG. 8 also represented by the redundancy notation ($A_7, A_6, A_5, A_4, A_3, A_2, A_1, A_0$) and ($B_7, B_6, B_5, B_4, B_3, B_2, B_1, B_0$).

When data in a redundancy binary notation is represented by two bits, a sum and a carry for each r bits, "r" is a "redundancy index" of this data. The redundancy index r of the data of FIG. 8 is 1.

Figure 9:
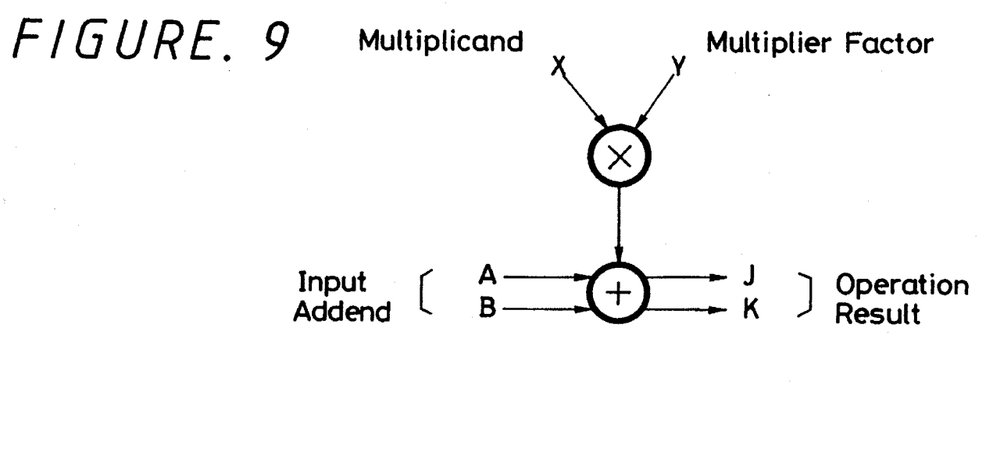
FIG. 9 is a view showing a multiplication-add circuit using a redundancy notation of a conventional multiplier.

The multiplier-adder of FIG. 8 is shown in FIG. 9. The input addend and the operation result are represented by two arrows in FIG. 9. The input addend and the operation result are represented by two arrows as shown in FIG. 9 to indicate that the data is represented by two signals corresponding to a carry and a sum for each bit.

Figure 10:
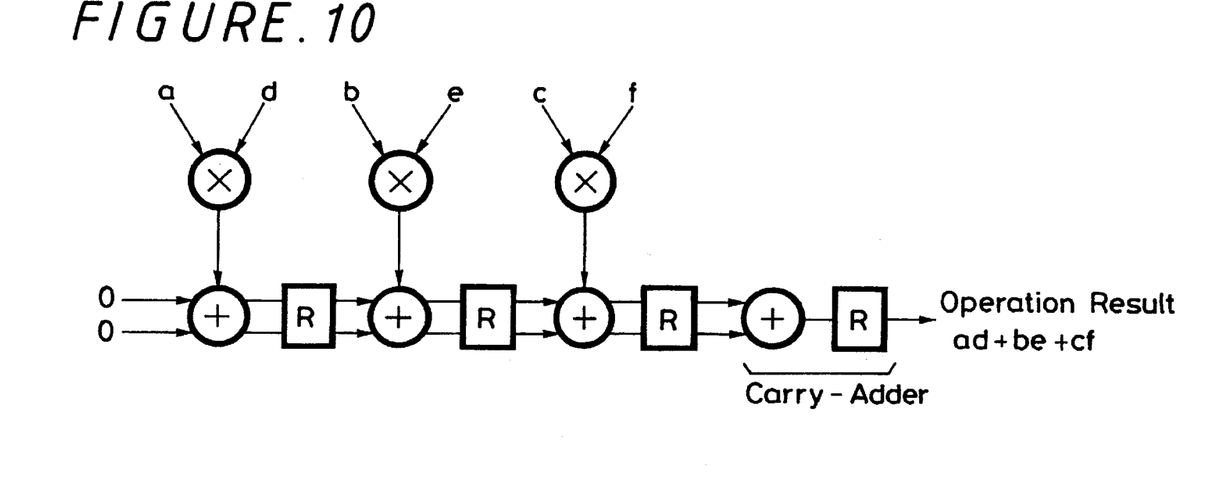
FIG. 10 is a view showing an inner product operation circuit using a redundancy notation of a conventional multiplier.

The inner product operation circuit using the multiplier-adder is shown in FIG. 10. A carry-adder for obtaining a operation result is only used on the last step in case of the inner product operation circuit of FIG. 10. Because each multiplier-adder does not perform a carry-add, the inner product operation circuit is operated at high speed. But the number of registers for transmitting data is twice as many as a circuit not using a redundancy notation such as FIG. 5.

Figure 11:
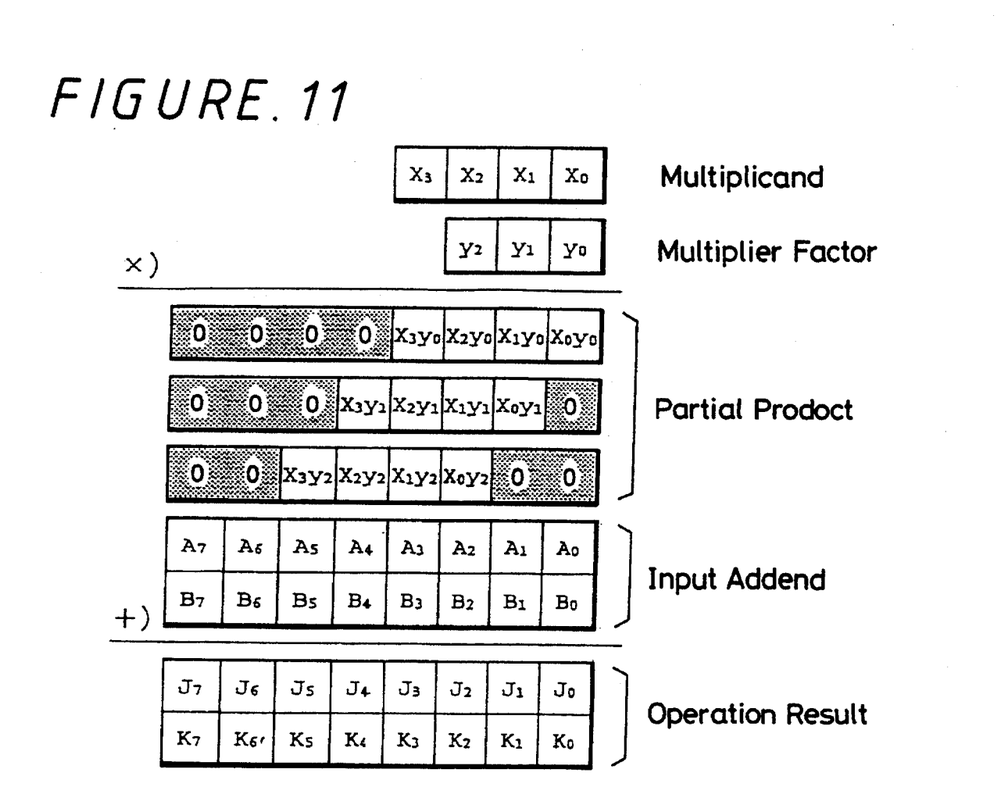
FIG. 11 is a view showing a multiplication-add circuit using a redundancy notation of a conventional multiplier.

A conventional program automatically generates the hardware description of the multiplier-adder shown in FIG. 8 when supplied with the respective word lengths of a multiplier factor, a multiplicand, an addend and an output. The principle is shown in FIG. 11. The constant 0 is inserted as digit fillers to conform the shape of the partial products. Then the signals which are allocated to the full adders (FA) are arranged regularly as shown in FIG. 12.

It is difficult to automatically generate the hardware description because the shape of the partial products as shown in FIG. 8 is irregular. As such, a constant 0 is inserted as shown in FIGS. 11 and 12, thus regularizing the shape of the partial product and facilitating automatic generation of the hardware description.

Because the shape made by the partial product and the input addend becomes a rectangle of eight times five (8*5), the program generating the hardware description automatically generates the full adders of eight times five (8*5). Then the corresponding signals are connected to each adder as shown in FIG. 12.

Figure 12:
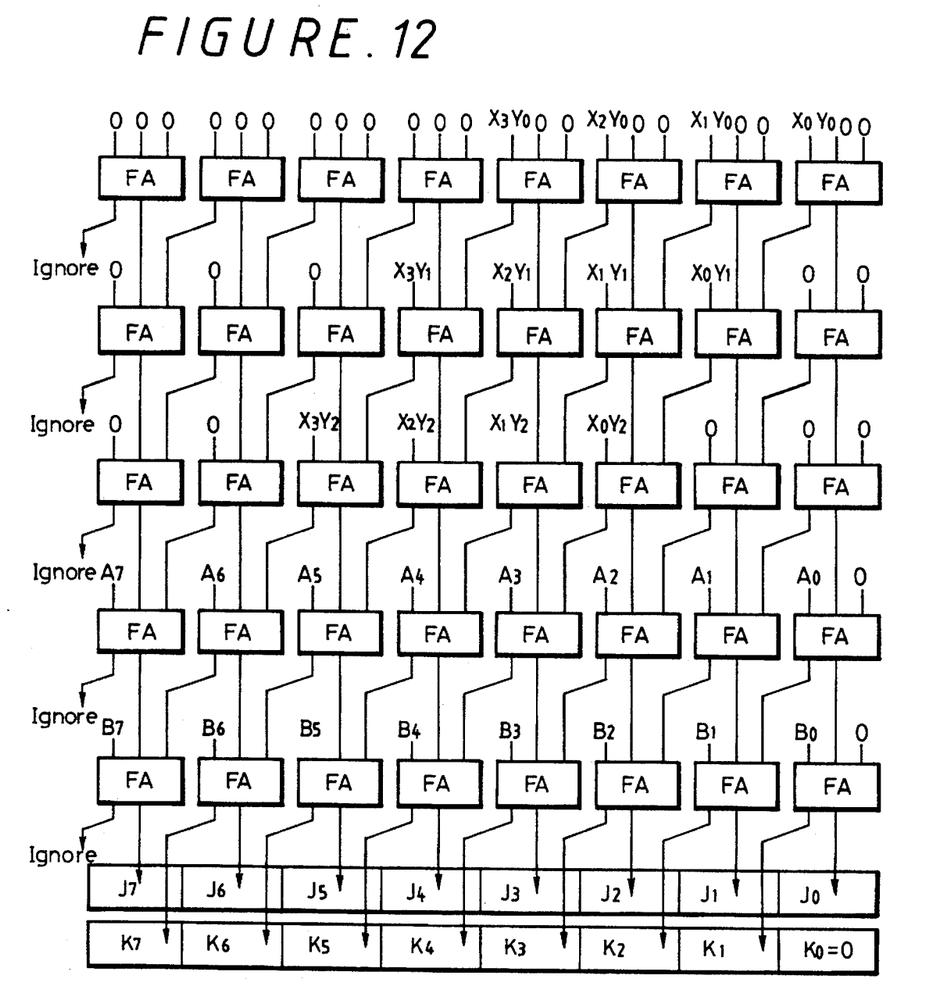
FIG. 12 is a view showing a multiplication-add circuit using a redundancy notation of a conventional multiplier.

FIG. 12 includes several useless full adders wherein a constant 0 is added to another constant 0. In a co-pending Japanese patent application (Hei 4-167727) entitled "Method FOR COMPRESSING A LOGIC CIRCUIT", a redundant circuit eliminating program is disclosed. The program eliminates the useless full adders and serves to convert a given circuit to an equivalent and smaller circuit. Since the output of the full adder is a constant, the full adder is replaced with a constant supplying circuit.

Figure 13:
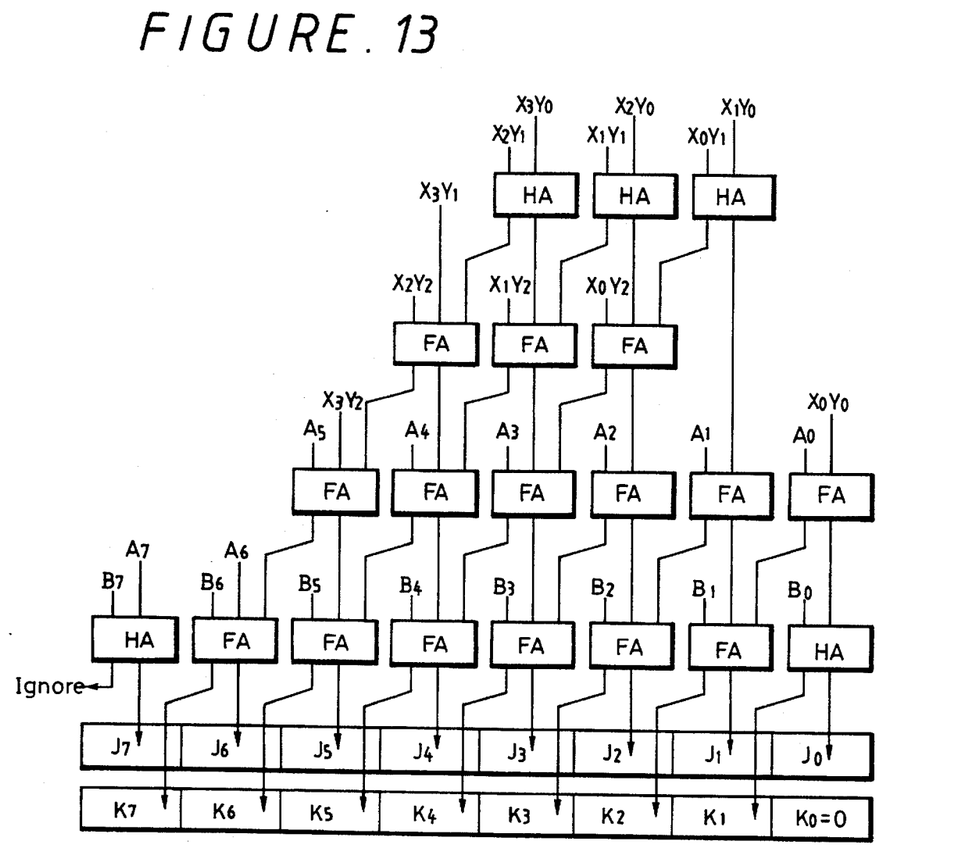
FIG. 13 is a view showing a multiplication-add circuit using a redundancy notation of a conventional multiplier.

The useless full adders are eliminated from the circuit by using the redundant circuit eliminating program. The circuit in FIG. 13 is obtained thereby. Because FIG. 13 is an irregular circuit, it is difficult to make the program directly generate such a hardware description automatically. However, the hardware description shown in FIG. 13 can be generated by using the simple program for automatically generating a regular hardware description and the program for eliminating the redundant circuit.

Each multiplier-adder in the above noted inner product operation circuit transmits data by the redundancy notation wherein the redundancy index is 1. As such, the number of pipeline registers is twice as many as in methods wherein redundancy notation is not used. In addition, each multiplier-adder is separated from a carry-adder in the above noted inner product operation circuit, thus providing faster operation and enabling completion of the operation before the end of the required cycle period. However, this hardware description results in a circuit having plural pipeline registers which unnecessarily increases size, complexity and cost. As such, there is a need for a hardware description having a reduced size.

SUMMARY OF THE INVENTION

One object of this invention is to provide a method for generating a hardware description of a multiplier or a multiplier-adder is utilized for integrating a digital signal processing circuit.

According to a first embodiment of this invention, a method for generating a hardware description of multiplier includes the steps of adding each partial product, generating a hardware description of a first add circuit for outputting the added result in a redundancy notation. Further it includes the steps of determining a redundancy index r in accordance with a time subtracting a delay time of the first add circuit from a maximum permitted delay time, dividing the data output from the first add circuit every r bits, adding the each divided data every r bits, generating a hardware description of a second add circuit for outputting the added result in a redundancy notation of r bits.

DETAILED DESCRIPTION OF THE INVENTION

The hardware description automatically generated by the method of this invention is as follows. The generated hardware description satisfies the required specifications, while the number of pipeline registers is less than a circuit implementing a conventional method.

Figure 14:
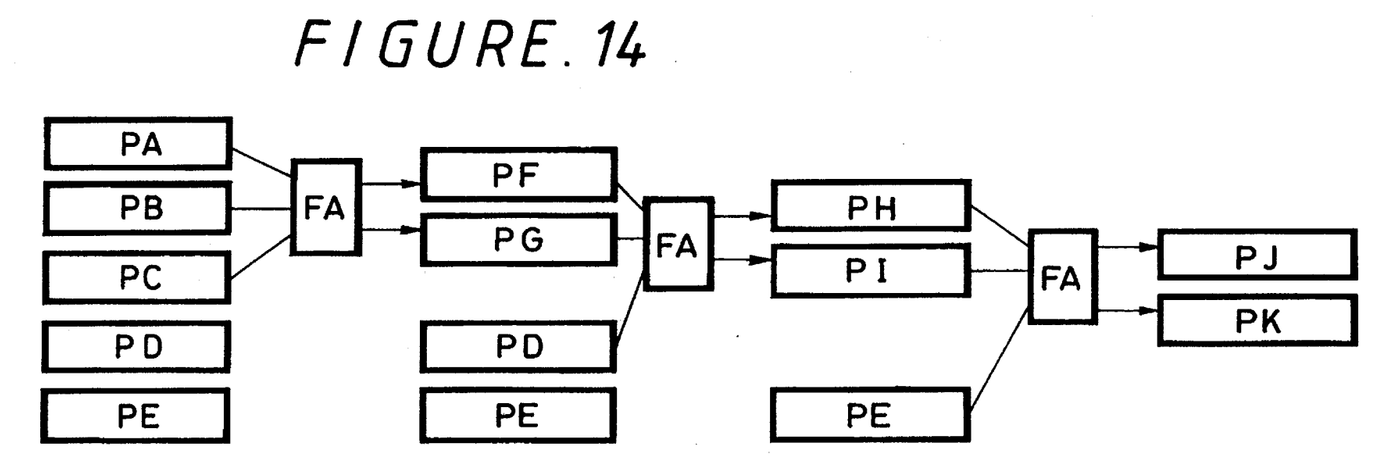
FIG. 14 is a view showing a method of adding using a carry-save array system.

The redundancy notation data output from each multiplier-adder is carry-added as many as it can within the remaining time. For instance when the data PA, PB, PC, PD and PE shown in FIG. 14 are added by carry-save format, three data inputs are converted to two data outputs by a each full adder. Therefore, it is necessary to execute three full adder operations as shown in FIG. 14 for obtaining the redundancy binary notation data PJ and PK.

The data PA, PB, PC, PD, PE, PJ and PK shown in FIG. 14 respectively correspond to the following as shown in FIG. 11.

PA=(0, 0, 0, 0, $X_3Y_0$, $X_2Y_0$, $X_1Y_0$, $X_0Y_0$)
PB=(0, 0, 0, $X_3Y_1$, $X_2Y_1$, $X_1Y_1$, $X_0Y_1$, 0)
PC=(0, 0, $X_3Y_2$, $X_2Y_2$, $X_1Y_2$, $X_0Y_2$, 0, 0)
PD=($A_7$, $A_6$, $A_5$, $A_4$, $A_3$, $A_2$, $A_1$, $A_0$)
PE=($B_7$, $B_6$, $B_5$, $B_4$, $B_3$, $B_2$, $B_1$, $B_0$)
PJ=($J_7$, $J_6$, $J_5$, $J_4$, $J_3$, $J_2$, $J_1$, $J_0$)
PK=($K_7$, $K_6$, $K_5$, $K_4$, $K_3$, $K_2$, $K_1$, $K_0$)

For example when the full adder takes 5 ns to perform one operation, the above-stated add operation takes 15 ns (5*3= 15 ns). If the operation time required of the entire circuit is 30 ns, the remaining time is 15 ns (30−15=15 ns).

Figure 2A:
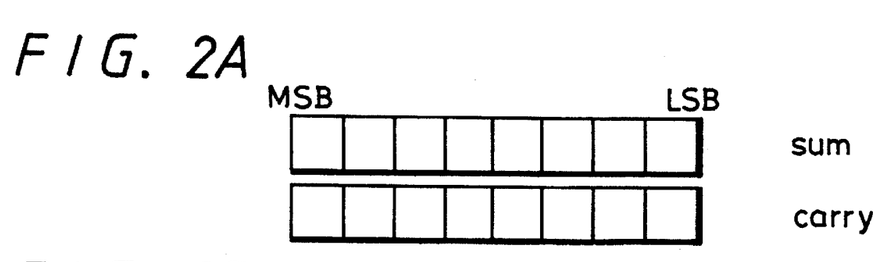
FIG. 2(A) is a data in redundancy binary notation.

The redundancy binary notation data shown in FIG. 2(A) are carry-added within the remaining time. The full adder takes 5 ns for a carry-add operation of one bit. It takes 15 ns for a carry-add operation of three bits.

Figure 2B:
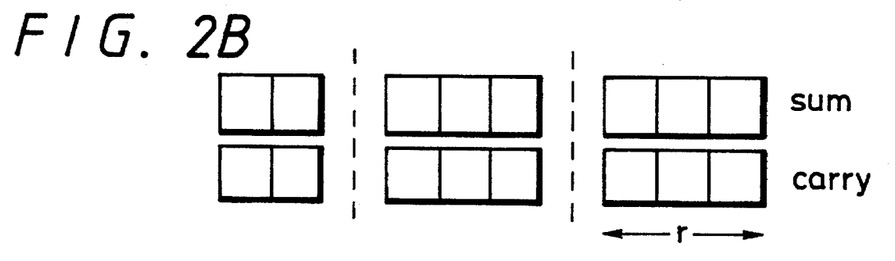
FIG. 2(B) is a data divided every r bits.
Figure 2C:
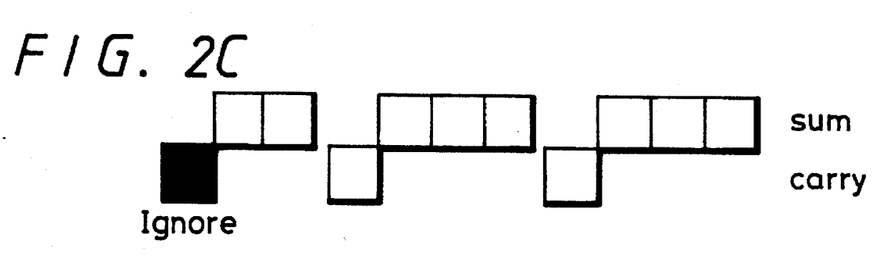
FIG. 2(C) is a data upon which a carry-add operation is performed every r bits.
Figure 2D:
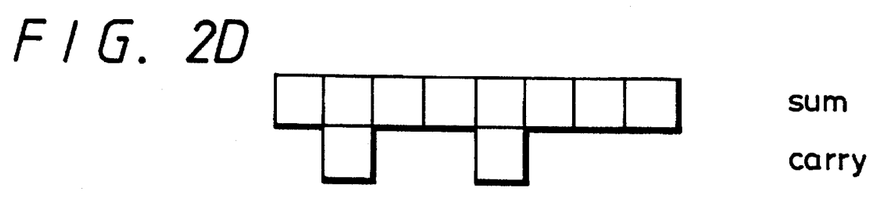
FIG. 2(D) is a data combined upon which a carry-add operation is performed every r bits.

The output is divided per three bits as shown in FIG. 2(B). After each divided part is carry-added as shown in FIG. 2(C), it is restored to the original state. The data such as FIG. 2(D) is obtained. This is having a redundancy index 3 which represents the original data. The content is the same as that of the original data. When the data of redundancy index 3 is output, the number of required pipeline registers is 10. While when the data of redundancy index 1 is output, the number of required pipeline registers is 16.

The conventional program only automatically generates a hardware description wherein the redundancy index is 1. So when an inner product operation circuit is constructed, the number of required pipeline registers connected between the multiplier-adders is 16 (word length * 2=16). In contrast, because the hardware description generated by the method of the present invention has a redundancy index 3, the number of required pipeline registers connected between the multiplier-adders is 10 as shown in FIG. 2(D).

Figure 1:
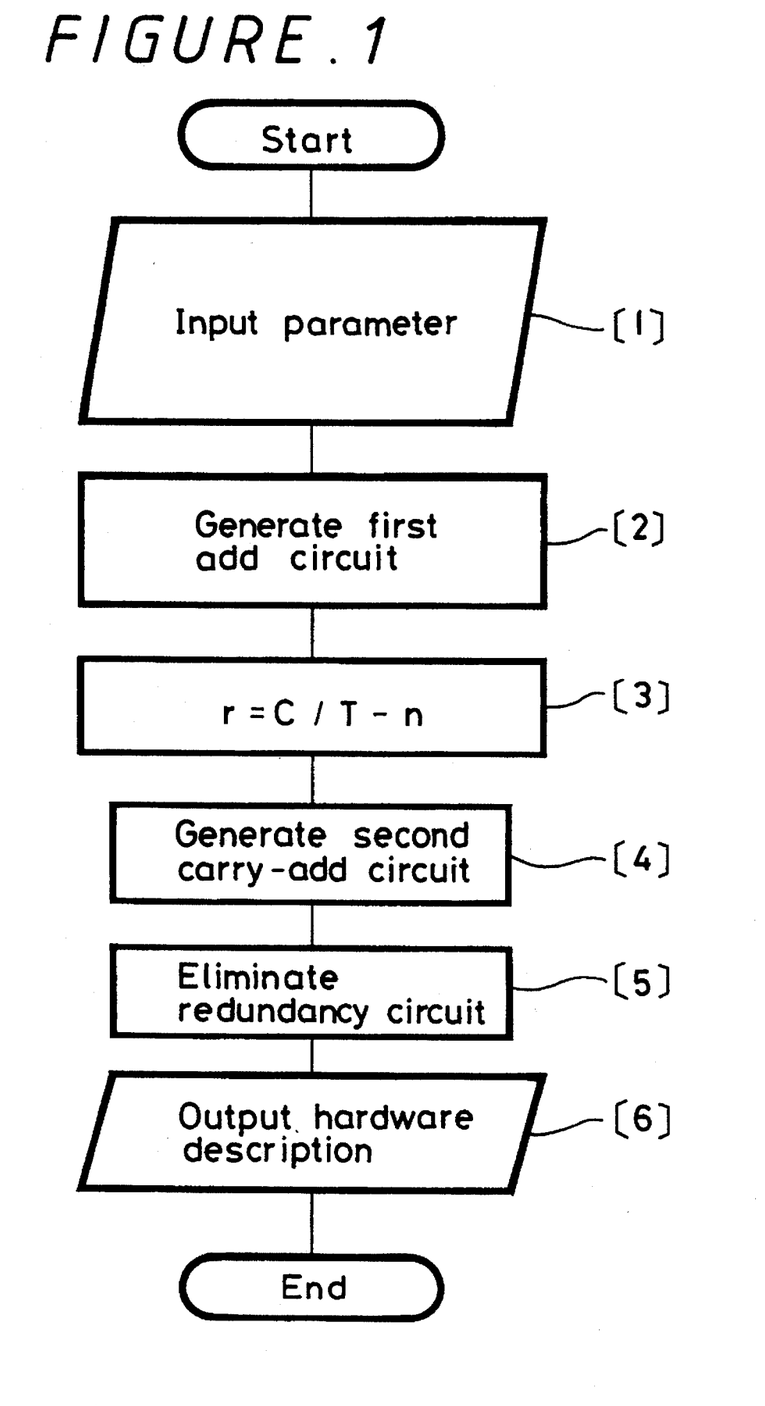
FIG. 1 is a flow chart showing a method for generating a hardware description of a multiplier-adder according to the present invention.

The present invention is a method for automatically generating the hardware description of the above-stated circuit wherein an operating cycle time is an input parameter. FIG. 1 is a flow chart of this invention.

First the time required for the operation of a multiplier-adder is calculated. Most of the operation time of the multiplier-adder is expended by the adding of partial products. So the operation time of the multiplier-adder is calculated by a product of a maximum passing step number and an operation time of a full adder. The maximum passing step number is the number of stages of full adders from the input to the output of the circuit for adding the partial products.

The number of stages of full adders in the circuit for adding partial products is calculated using a word length of the multiplier factor, a word length of the multiplicand, a kind of multiplication method and a kind of add method.

For example when m bits are multiplied by n bits on the multiplier-adder shown in FIG. 8, the number of partial products is n. When the input addend in redundancy notation is included, the total number of data is (n+2). When the (N+2) partial products are added by the carry-save system, n stages of full adders is required.

When it takes T ns for operation of each state of the full adders, it takes T*n ns for operation of the circuit for adding the partial products. Therefore, the operation time of the multiplier-adder is also T*n ns.

When an operation cycle time required for this multiplier-adder is C ns, the remaining time is (C–T*n) ns.

When a redundancy index r is (C/T–n), the operation of r full adders is performed within the remaining time. Namely the carry add of r bits is performed.

The output is divided every r bits. And a small carry adder is respectively added to each divided output. As a result, the output having redundancy index r is obtained.

Furthermore, making reference to FIG. 1, this invention is explained as follows.

At step 1, all parameters generated in the multiplier-adder are input. The parameters are a word length m of multiplicand, a word length n of multiplier factor, a word length w of input addend or operation output, an operation cycle time C and an operation time T of the full adder.

At step 2, the constant 0 is inserted in the partial products and the input addend to make the shape of the partial products regular (FIG. 11). The number of full adders becomes w in the direction of width and the number of full adders becomes (n+2) in the direction of length. Then a description of a first add circuit is generated as shown in FIG. 12.

At step 3, the redundancy index r of the operation is determined by the expression (C/T–n).

Figure 15:
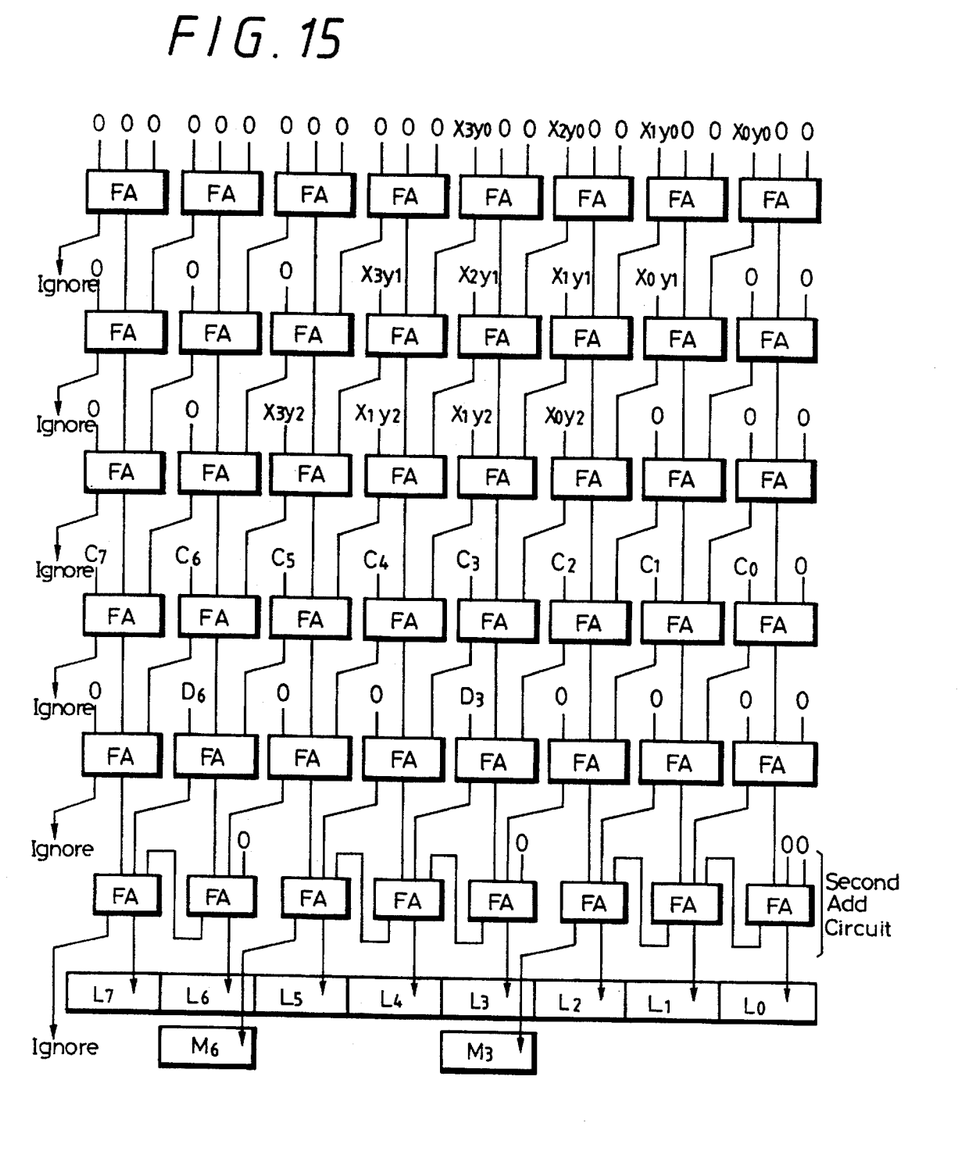
FIG. 15 is a view showing a first multiplication-add circuit using a redundancy notation in accordance with the present invention.

At step 4, the output is divided every r bits. A description of a second add circuit which performs a carry add to each divided output is generated. The second add circuit is added to the first add circuit. FIG. 15 shows a third add circuit which is a combination of the first and second add circuits. In FIG. 15, the input addends are now designated as $C_7$–$C_0$, $D_6$ and $D_3$ for purposes of illustration and correspond to the addends previously shown in FIG. 12. In addition, the outputs are now designated as $L_7$–$L_0$, $M_6$ and $M_3$ and correspond to the output previously shown in FIG. 12.

Figure 16:
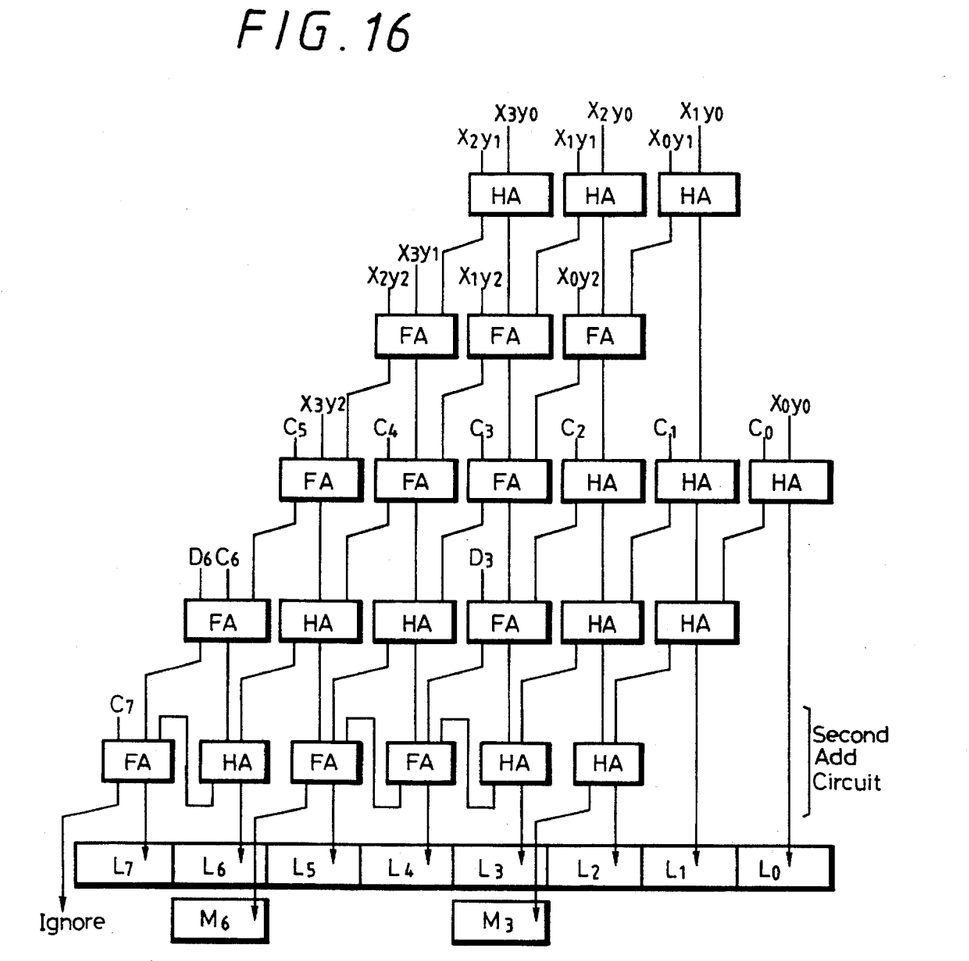
FIG. 16 is a view showing a second multiplication-add circuit using a redundancy notation in accordance with the present invention.

At step 5, useless circuits are eliminated from the hardware description by using a redundancy circuit eliminating program. The full adder wherein 0 is added to 0 is eliminated thereby. The full adder wherein 0 is added to a constant excepting 0 or an operation result is changed to a half adder (HA) thereby. FIG. 16 shows the add circuit without the useless circuits.

At step 6, the hardware description (net list) is output.

Figure 3A:
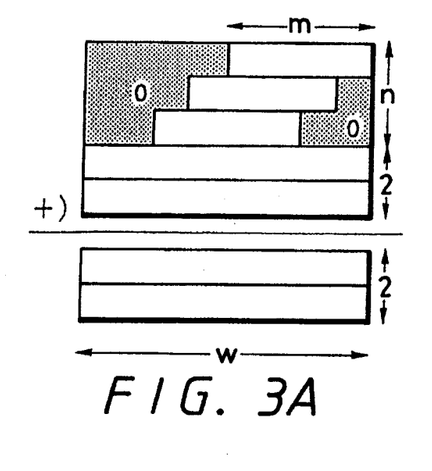
FIG. 3(A) is an example of a conventional multiplication-add circuit.
Figure 3B:
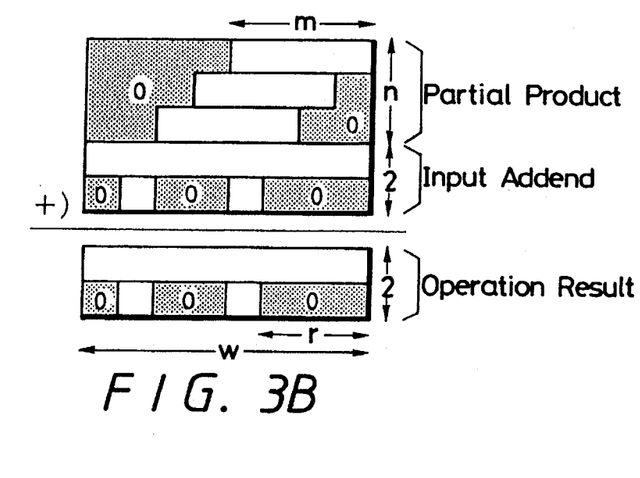
FIG. 3(B) is an example of a multiplication-add circuit in accordance with the present invention.

The comparison between the conventional multiplier-adder and the multiplier-adder of this invention is shown in FIG. 3. In FIG. 3, m is a word length of multiplicand, n is a word length of multiplier factor, w is a word length of input addend or operation output. Furthermore, r is a redundancy index of operation result in the multiplier-adder of this invention.

The operation of the multiplier-adder is as follows. The partial products obtained by multiplication are added to the input addend. Then the operation result in a redundancy binary notation is output. In the conventional multiplier-adder the data of (m*n+w*2) bits is compressed to the data of (w*2) bits with an adder.

A full adder converts a data of 3 bits to a data of 2 bits. As a result, each full adder can decrease the number of data bits by one. Therefore, (M*n) the full adders are required in order to decrease the data of (m*n).

Instead of adding the second add circuit to the first add circuit, the number of pipeline registers for holding the output is decreased. When plural multiplier-adders are combined as shown in FIG. 10, the size of the carry adder at the last step is substantially reduced. As such, the total size of circuit becomes small.

This is similar to the multiplier-adder in this invention. Namely a data of (n*m+w+w/r) bits is compressed to a data of (w+w/r) bits in the multiplier-adder of this invention. The number of the full adders required for this compression is (m*n). The number of the full adders required for this invention is the same as that of the conventional one.

Therefore the number of registers required for holding the operation result in the multiplier-adder of this invention is (r–1) less than that in the conventional multiplier-adder for every r bits in the word length of the output.

The circuit of the present invention has been described hereinabove using carry-save type adder as an example. The present invention can also be applied to a circuit using a Wallace tree adder.

When an inner product operation circuit is constituted by combining multiplier-adders using a redundancy notation, the automatically generated multiplier-adders in accordance with the present invention can be used. The maximum number of carry-add operations within the required operation cycle time are performed which reduces the required number of the pipeline registers.

This invention is also applied to a multiplier. The multiplier circuit doe not have the addend input in the multiplier-adder shown in FIG. 3. So the hardware description of the multiplier which output has redundancy every r bits is generated by a similar method generating a hardware description of multiplier-adder. This is explained, while making reference to FIG. 4.

At first, the time required for operation on a multiplier is calculated. Most of the operation time of the multiplier is extended by a circuit for adding partial products. The operation time of the multiplier is the product of the passing step number and the operation time for a full adder. The passing step number is the number of stages of full adders from the input to the output in the circuit for adding partial products.

The products number of stages of full adders in the circuit for adding partial products is calculated using a word length of multiplier factor, a word length of multiplicand, a kind of multiplication method and a kind of add method.

Figure 4A:
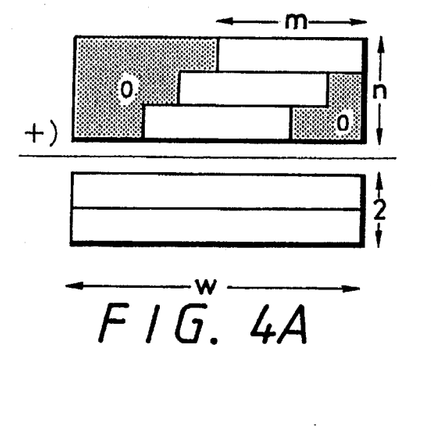
FIG. 4(A) is an example of a conventional multiplier.
Figure 4B:
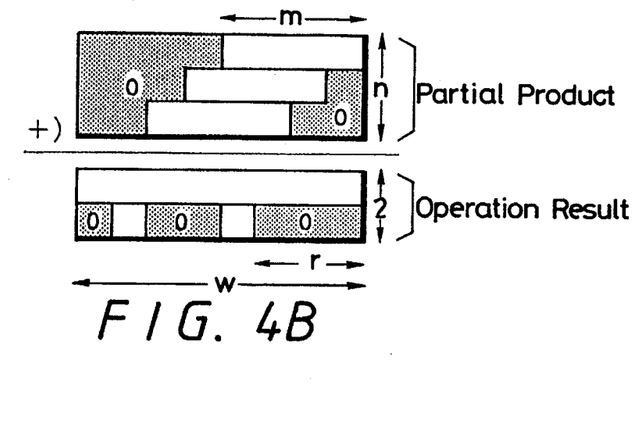
FIG. 4(B) is an example of a multiplier in accordance with the present invention.

For example when m bits are multiplied by n bits using the multiplier of FIG. 4, the number of partial products calculated is n. When the n partial products are added by the carry-save system, (n–2) stages of full adders are required.

When it takes T ns each stage of for the full adders, it takes T*(n–2) ns for the operation time of the circuit for adding partial products. Therefore, it also takes T*(n–2) ns for the operation time of the multiplier.

When the operation cycle time required for this multiplier is C ns, the remaining time is C–T*(n–2) ns.

When the redundancy index r is C/T–(n–2), the operation of r full adders is performed within the remaining time. Namely the carry add of r bits is performed.

The output is divided every r bits. And a small carry adder is respectively added to each divided output. As a result, the output having the redundancy index r is obtained.

The number of registers required for holding an operation result on this invention is (r–1) every r bits less than that on the conventional multiplier for every r bits in the word length of the output. While this invention has been described in conjunction with specific embodiments, it is evident that many alternatives, modifications, permutations and variations will become apparent to those skilled in the art in light of the foregoing description. Accordingly, it is intended that the present invention embraces all such alternatives, modifications and variations as fall within the scope of the appended claims.

What is claimed is:

1. Method for generating a hardware description of a multiplier which is used in the integration of a digital signal processing circuit, comprising the steps of:

acquiring input parametric values including a word length m of a multiplicand, a word length n of a multiplier, a word length w of an operation output, an operation cycle time C of said multiplier and an operation time T of full adders used in said multiplier;

generating a hardware description of a first add circuit for adding partial products of said multiplicand and multiplier using at least said full adders and for outputting a result in a redundancy notation;

determining a redundancy index r in accordance with a time remaining from said operation cycle time C following an operation time of said first add circuit, said redundancy index r being equal to (C/T−(n−2)); and generating a hardware description of a second add circuit for performing a carry-add operation for every r bits of said addition output by said first add circuit, and for outputting a result of said carry-add operation in a redundancy notation of r bits.

2. Method for generating a hardware description of a multiplier-adder which is used in the integration of a digital signal processing circuit, comprising the steps of:

acquiring input parametric values including a word length m of a multiplicand, a word length n of a multiplier, a word length w of an operation output, an operation cycle time C of said multiplier and an operation time T of full adders used in said multiplier;

generating a hardware description of a first add circuit for adding partial products of said multiplicand and multiplier and an input addend using at least said full adders and for outputting a result in a redundancy notation;

determining a redundancy index r in accordance with a time remaining from said operation cycle time C following an operation time of said first add circuit, said redundancy index r being equal to (C/T−n); and generating a hardware description of a second add circuit for performing a carry-add operation for every r bits of said addition output by said first add circuit, and for outputting a result of said carry-add operation in a redundancy notation of r bits.

3. Method for generating a hardware description of a multiplier which is used in the integration of a digital signal processing circuit, comprising the steps of:

acquiring input parametric values including a word length n of a multiplier factor, a word length m of a multiplicand, a word length w of an operation output, an operation cycle time C of said multiplier and an operation time T of full adders used in said multiplier;

generating a hardware description of a first add circuit for carry-save adding partial products of said multiplicand and multiplier using at least said full adders, wherein the number of said full adders is w in the direction of width and the number of said full adders is n in the direction of length;

determining a redundancy index r by using said word length n of said multiplier factor, said word length m of said multiplicand, said word length w of said operation output, said operation cycle time C of said multiplier and said operation time T of said full adders;

generating a hardware description of a second add circuit for performing a carry-add operation for every r bits of the carry-save addition output of said first add circuit and for outputting a result of the carry-add operation in a redundancy notation of r bits;

combining said hardware description of said second add circuit with said hardware description of said first add circuit to form a hardware description of a third add circuit;

replacing useless components of said hardware description of said third add circuit; and outputting said hardware description of said third add circuit with useless components replaced.

4. Method for generating a hardware description of a multiplier-adder which is used in the integration of a digital signal processing circuit, comprising the steps of:

acquiring input parametric values including a word length n of a multiplier factor, a word length m of a multiplicand, a word length w of an operation output, an operation cycle time C of said multiplier and an operation time T of full adders used in said multiplier;

generating a hardware description of a first add circuit for carry-save adding partial products of said multiplicand and multiplier and an input addend using at least said full adders, wherein the number of said full adders is w in the direction of width and the number of said full adders is (n+2) in the direction of length;

determining a redundancy index r by using said word length n of said multiplier factor, said word length m of said multiplicand, said word length w of said operation output, said operation cycle time C of said multiplier and said operation time T of said full adders;

generating a hardware description of a second add circuit for performing a carry-add operation for every r bits of the carry-save addition output of said first add circuit and for outputting a result of the carry-add operation in a redundancy notation of r bits;

combining said hardware description of said second add circuit with said hardware description of said first add circuit to form a hardware description of a third add circuit;

replacing useless components of said hardware description of said third add circuit; and outputting said hardware description of said third add circuit with useless components replaced.

5. A multiplier circuit for integrating a digital signal processing circuit which has an operation cycle time C, comprising:

adder means for performing carry-save addition on a plurality of partial products of a multiplicand and a n-bit multiplier, and generating sum signals and carry signals corresponding to respective bits of an output word, said adder means including a plurality of adders each having an operation time T, wherein said output word has a redundancy index r equal to (c/T−(n−2);

carry-adder means for generating said output word by performing carry additions of every r of said sum signals and respective of said carry signals supplied by said adder means, and supplying an output including said output word and carry outputs of said carry additions of said every r of said sum signals and said respective r of said carry signals supplied by said adder means; and registers for latching said output of said carry-adder means every said operation cycle time C.

6. A multiplier-adder circuit for integrating a digital signal processing circuit which has an operation cycle time C, comprising:

adder means for performing carry-save addition on a plurality of partial products of a multiplicand and a n-bit multiplier and on an input added, and generating sum signals and carry signals corresponding to respective bits of an output word, said adder means including a plurality of adders each having an operation time T, wherein said output word has a redundancy index r equal to (C/T−n);

carry-adder means for generating said output word by performing carry additions of every r of said sum signals and respective r of said carry signals supplied by said adder means, and supplying an output including said output word and carry outputs of said carry additions of said every r of said sum signals and said respective r of said carry signals supplied by said adder means; and registers for latching said output of said carry-adder means every said operation cycle time C.

* * * * *